(12) United States Patent
Shakuda

(10) Patent No.: US 8,421,119 B2
(45) Date of Patent: Apr. 16, 2013

(54) GAN RELATED COMPOUND SEMICONDUCTOR ELEMENT AND PROCESS FOR PRODUCING THE SAME AND DEVICE HAVING THE SAME

(75) Inventor: Yukio Shakuda, Kyoto (JP)

(73) Assignee: Rohm Co., Ltd. (JP)

( * ) Notice: Subject to any disclaimer, the term of this patent is extended or adjusted under 35 U.S.C. 154(b) by 373 days.

(21) Appl. No.: 11/854,585

(22) Filed: Sep. 13, 2007

(65) Prior Publication Data
US 2008/0099767 A1    May 1, 2008

(30) Foreign Application Priority Data

Sep. 13, 2006   (JP) .............................. P2006-248215
Sep. 13, 2006   (JP) .............................. P2006-248219
Sep. 15, 2006   (JP) .............................. P2006-251146

(51) Int. Cl.
*H01L 29/66*   (2006.01)

(52) U.S. Cl.
USPC ............. 257/135; 257/134; 257/187; 257/78; 257/E33.034; 257/E33.03

(58) Field of Classification Search ........... 257/E33.025, 257/E33.033, 192, 183, 189, 187, 194, E21.407, 257/E29.127, 78, 11, 631, E33.019, E33.024, 257/E33.03, E33.04, 134, 135
See application file for complete search history.

(56) References Cited

U.S. PATENT DOCUMENTS

| | | | | |
|---|---|---|---|---|
| 4,101,344 A | * | 7/1978 | Kooi et al. | 438/280 |
| 6,163,557 A | * | 12/2000 | Dunnrowicz et al. | 372/46.01 |
| 6,248,643 B1 | * | 6/2001 | Hsieh et al. | 438/424 |
| 6,252,261 B1 | * | 6/2001 | Usui et al. | 257/190 |
| 6,346,438 B1 | * | 2/2002 | Yagishita et al. | 438/197 |
| 6,426,264 B1 | * | 7/2002 | Kawai | 438/311 |
| 6,586,819 B2 | * | 7/2003 | Matsuoka | 257/628 |

(Continued)

FOREIGN PATENT DOCUMENTS

| | | |
|---|---|---|
| JP | 4-92439 A | 3/1992 |
| JP | 2001-230410 A | 8/2001 |

(Continued)

OTHER PUBLICATIONS

Ben-Yaacov et al. AlGaN/GaN current aperture vertical electron transistors with regrown channels. Journal of Applied Physics. vol. 95, No. 4, 2004, pp. 2073-2078.*

(Continued)

*Primary Examiner* — Colleen Matthews
*Assistant Examiner* — Galina Yushina
(74) *Attorney, Agent, or Firm* — Cantor Colburn LLP

(57) ABSTRACT

A GaN related compound semiconductor element includes: a channel layer made of a GaN related compound semiconductor; and a source layer and a drain layer, which are disposed in a manner of sandwiching the channel layer. The source layer includes two adjacent ridge portions which are formed by selective growth. A source electrode is formed over the surface, sandwiched by the ridge portions, of the channel layer, and the surfaces of the respective two adjacent ridge portions. The selective-growth mask formed between the two ridge portions is removed by wet etching. In addition, as another embodiment, a gate electrode is formed in a manner that the direction of the longer dimension of the gate electrode is aligned with the m plane of the channel layer. Moreover, as still another embodiment, the channel layer has a multilayer structure in which a GaN layer doped with no impurity is used as an intermediate layer.

10 Claims, 13 Drawing Sheets

U.S. PATENT DOCUMENTS

| | | | |
|---|---|---|---|
| 7,928,429 B2 * | 4/2011 | Lee et al. | 257/40 |
| 2003/0140846 A1 * | 7/2003 | Biwa et al. | 117/89 |
| 2003/0141508 A1 * | 7/2003 | Okuyama et al. | 257/79 |
| 2005/0145883 A1 * | 7/2005 | Beach et al. | 257/194 |
| 2005/0164475 A1 * | 7/2005 | Peckerar et al. | 438/492 |
| 2005/0167677 A1 * | 8/2005 | Okuyama et al. | 257/77 |
| 2006/0113561 A1 * | 6/2006 | Sankin et al. | 257/134 |
| 2006/0128124 A1 * | 6/2006 | Haskell et al. | 438/483 |
| 2006/0157804 A1 * | 7/2006 | Ueda | 257/401 |
| 2006/0220042 A1 * | 10/2006 | Yaegashi et al. | 257/94 |
| 2006/0261371 A1 * | 11/2006 | Kuroda et al. | 257/194 |

FOREIGN PATENT DOCUMENTS

| | | |
|---|---|---|
| JP | 2002-252423 A | 9/2002 |
| JP | 03/071607 A1 | 8/2003 |
| JP | 2004-96061 A | 3/2004 |
| JP | 2004-260140 A | 9/2004 |
| JP | 2004-327766 A | 11/2004 |
| JP | 2005-354101 * | 12/2005 |
| JP | 2006-190991 A | 7/2006 |
| JP | 2006-517726 A | 7/2006 |
| WO | 2004/008495 A2 | 1/2004 |
| WO | 2006/022872 A1 | 3/2006 |

OTHER PUBLICATIONS

Sakai. Defect structure in selectivwely grown GaN films with low threading dislocaation density. Appl Phys. Lett. 71 916) 1997, pp. 2259-2261.*

Office Action for Japanese Patent Application No. 2006-251146, dated May 22, 2012, Japanese translation only.

Office Action for Japanese Application No. 2006-248215, dated Apr. 24, 2012 (Japanese version only).

Office Action for Japanese Application No. 2006-248219, dated Apr. 24, 2012 (Japanese version only).

* cited by examiner

REGION WHERE SELECTIVE-GROWTH MASK IS REMOVED

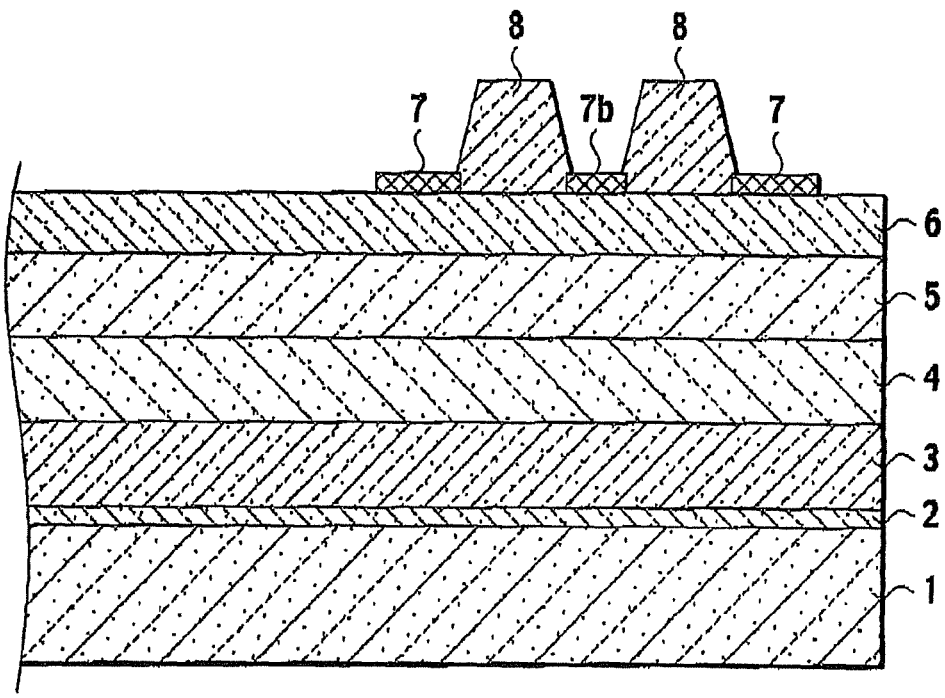
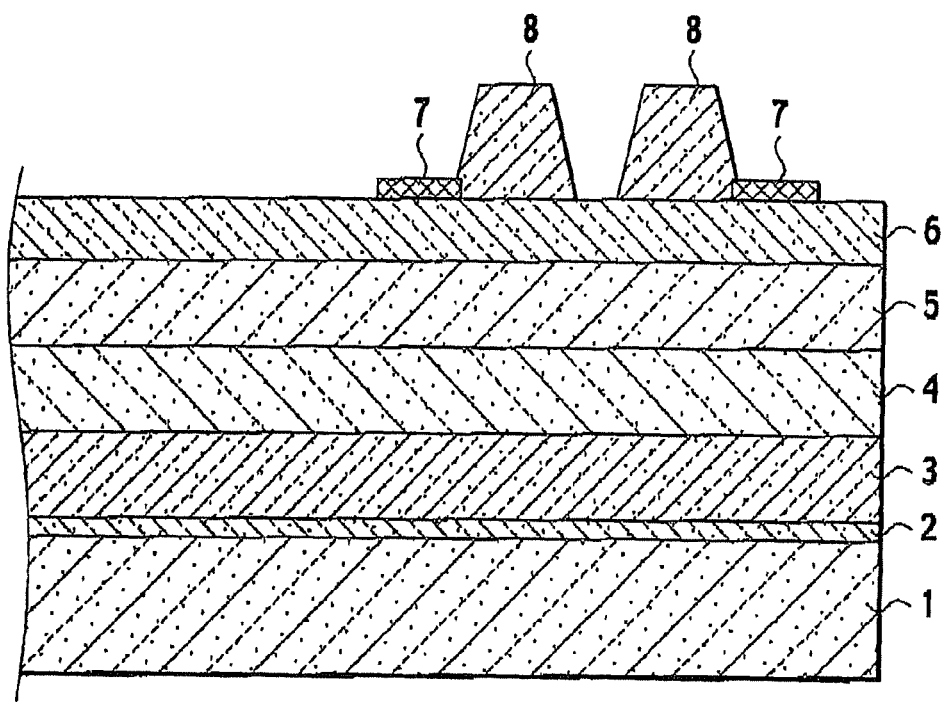

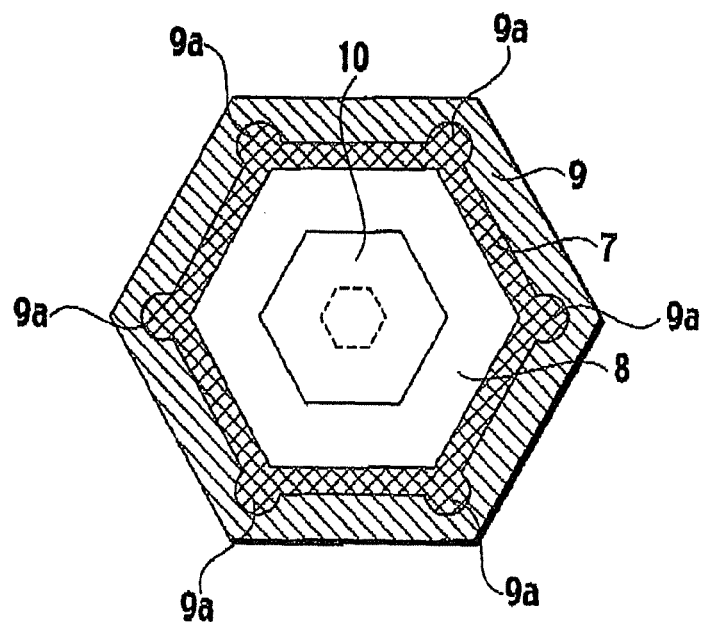
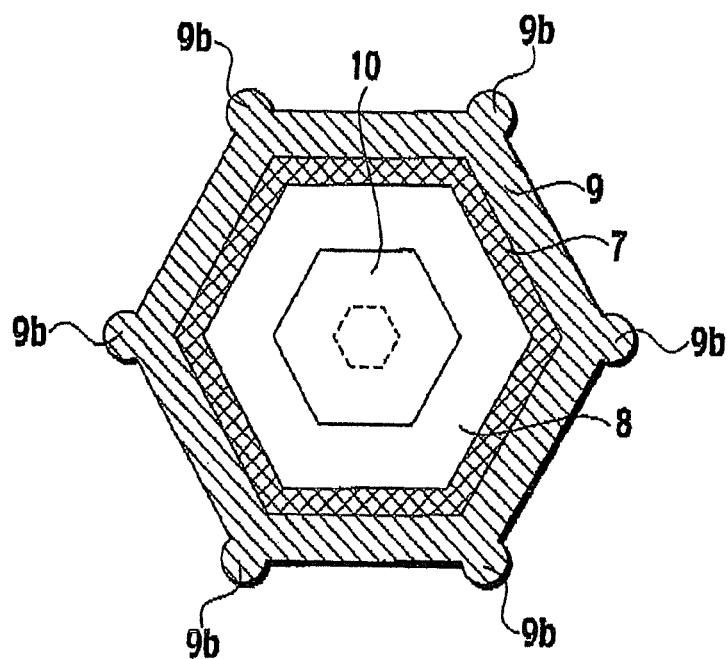

GAN RELATED COMPOUND SEMICONDUCTOR ELEMENT AND PROCESS FOR PRODUCING THE SAME AND DEVICE HAVING THE SAME

CROSS REFERENCE TO RELATED APPLICATIONS AND INCORPORATION BY REFERENCE

This application is based upon and claims the benefit of prior Japanese Patent Application P2006-248215 filed on Sep. 13, 2006 and P2006-248219 filed on Sep. 13, 2006 and P2006-251146 filed on Sep. 15, 2006; the entire contents of which are incorporated by reference herein.

BACKGROUND OF THE INVENTION

1. Field of the Invention

The present invention relates to a GaN related compound semiconductor element used as, for example, a semiconductor amplification element such as a power transistor capable of producing a large current, to a process for producing the same, and to a GaN related compound semiconductor device.

2. Description of the Related Art

A MOS-FET, a HEMT (High Electron Mobility Transistor), or the like, using a GaN related group III-V compound semiconductor, such as GaN or AlGaN, for a channel layer has attracted attention as a device having high breakdown voltage characteristics and being capable of operating at a high temperature with a large electric current. This is because the on-resistance, during the operation, of the device using a GaN related group III-V compound semiconductor is smaller than that of a device using Si, GaAs, or the like, by one digit or more. As an example of such devices, Japanese Patent Application Laid-open Publication No. 2004-260140 describes a group III nitride semiconductor element.

There is a GaN related compound semiconductor element having a ridge portion as shown in FIG. 18, for example. In this GaN related compound semiconductor element, a GaN buffer layer 52, an undoped GaN layer 53, an n$^+$ type GaN drain layer 54, an n$^-$ type GaN layer 55, a p type GaN channel layer 56 are stacked on a semi-insulating sapphire substrate 51. An n type GaN source layer 57 having a ridge stripe shape is formed on the p type GaN channel layer 56. In addition, a source electrode 60 is formed over the entire surface of the ridge shape of the n type GaN source layer 57, as well as part of the surface of the p type GaN channel layer 56.

On the other hand, a gate electrode 59 is formed on an insulating film 58 stacked on the surface of the p type GaN channel layer 56. A drain electrode 61 is formed on exposed part of the surface of the n$^+$ type GaN drain layer 54 subjected to mesa etching.

However, in the above-described conventional GaN related compound semiconductor element, the following problem arises. In a process for producing the GaN related compound semiconductor element shown in FIG. 18, the GaN buffer layer 52 to the n type GaN source layer 57 are firstly stacked on the sapphire substrate 51, and thereafter, the n type GaN source layer 57 is shaped into the ridge shape by mesa etching. However, since it is difficult to remove, by wet etching, the GaN related compound semiconductor, which is hard, dry etching using plasma irradiation or the like is generally employed.

When the ridge portion of the n type GaN source layer 57 is formed by this dry etching, it is necessary that the entire n type GaN source layer 57 be removed except the ridge portion by the dry etching. As a result, the exposed surface (the portion indicated by xxx in FIG. 18) of the p type GaN channel layer 56 is often damaged.

If the surface of the p type GaN channel layer 56 is damaged as described above, a Schottky contact is formed in the junction region between the p type GaN channel layer 56 and the source electrode 60. As a result, the contact resistance between the p type GaN channel layer 56 and the source electrode 60 is increased, thus preventing an electric current from flowing in the element. In addition, when the p type GaN channel layer 56 is damaged, the interface state density of the p type GaN channel layer 56 is increased. Accordingly, when a positive voltage is applied to the gate electrode 59, the p type GaN channel layer 56 is not immediately inverted to the n type channel. For this reason, it takes time to form a population inversion state. As a result, since the on-resistance is increased, the element cannot operate at a high speed.

Moreover, in the above-described conventional GaN related compound semiconductor element, when a bias voltage is applied to the gate electrode 59, a depletion layer is formed in the p type GaN channel layer 56 as shown in FIG. 17. However, this depletion layer is unlikely to expand in the lateral directions (the left and right directions in FIG. 17). With no lateral expansion, the depletion layer cannot reach a vicinity of the n type GaN source layer 57. In this case, the population inversion is difficult to occur, so that the on-resistance is increased. As a result, a problem arises that a current does not flow between the drain electrode 61 and the source electrode 60.

Furthermore, in the above-described conventional GaN related compound semiconductor element, the following problem may also occur. FIG. 12 illustrates a wurtzite single crystal structure, and shows the orientations and the like of the structure. The crystal structure of sapphire is represented by a crystal structure of a hexagonal system as shown in FIG. 12. When a GaN related compound semiconductor layer is stacked on a sapphire substrate as shown in FIG. 17 or 18, the c plane (0001) of the sapphire substrate is generally used. The GaN related compound semiconductor layers stacked on the sapphire substrate of the (0001) orientation have a wurtzite crystal structure (the crystal structure shown in FIG. 12) of the (0001) orientation, and also have a crystal polarity allowing the cation element of Ga to grow in the direction of the growth surface (to grow in the c-axis direction). Accordingly, all the GaN related compound semiconductor layers staked on the c plane (0001) of the sapphire substrate grow in the direction of the growth surface on the c plane (0001).

As shown in FIG. 12, the m plane (10-10), which is a prismatic plane of a single crystal, is a fundamental plane constituting each individual single crystal. For this reason, a crystal is likely to be cracked along the m plane. Accordingly, when a crack occurs in a wafer, the crack runs along the m planes. This crack sometimes cut off an electrode provided to the element.

As shown in FIG. 17 or FIG. 18, since the gate electrode 59 is formed on the insulating film 58, the gate electrode 59 has a gate capacitance. With an increased gate capacitance, it takes a longer time to switch ON and OFF of the element even when an ON-OFF switching voltage is applied to the gate electrode 59. In addition, since an increase in the gate capacitance causes also an increase in the power consumption, the area of the gate electrode 59 is generally made as small as possible. For this purpose, the gate electrode 59 is provided in the stripe shape with a small wiring width. Accordingly, such gate electrode 59 is weak against a breaking force in a direction substantially perpendicular to the extending direction of the stripe shape.

Since the p type GaN channel layer 56 grows in the direction of the growth surface on the c plane as described above, the directions of the m planes are sometimes aligned in a direction substantially perpendicular to the direction in which the gate electrode 59 extends in the stripe shape. In such a case, when a crack occurs in the p type GaN channel layer 56, the crack runs along the m planes. Accordingly, the gate electrode 59 is easily cut off in a direction of the shorter dimension of the gate electrode 59. When the gate electrode 59 is cut off, the population inversion does not occur in the p type GaN channel layer 56, and thus the element is not switched to the ON state. As a result, a current does not flow in the element.

The present invention has been made for the purpose of solving the above-described problems. An object of the present invention is to provide a GaN related compound semiconductor element which is capable of reducing the on-resistance by securely causing a population inversion to occur in a channel layer, and to provide also a process for producing the GaN related compound semiconductor element, as well as a GaN related compound semiconductor device.

SUMMARY OF THE INVENTION

A first aspect of the present invention is a GaN related compound semiconductor element. The GaN related compound semiconductor element includes a channel layer made of a GaN related compound semiconductor, a source layer including two adjacent ridge portions formed therein by selective growth, a drain layer, and a source electrode. The channel layer is sandwiched by the source layer and the drain layer. The source electrode is formed over the surface, sandwiched by the ridge portions, of the channel layer, and the surfaces of the respective two adjacent ridge portions.

A second aspect of the present invention is the GaN related compound semiconductor element according to the first aspect, and is characterized by further including: a selective-growth mask left on the surface of the channel layer after being used for the selective growth; and a gate electrode formed on the selective-growth mask.

A third aspect of the present invention is a GaN related compound semiconductor device including the GaN related compound semiconductor element according to the first aspect.

A fourth aspect of the present invention is a process for producing a GaN related compound semiconductor element including: a channel layer made of a GaN related compound semiconductor; a source layer; and a drain layer, the channel layer being sandwiched by the source layer and the drain layer. The process includes the steps of: depositing a selective-growth mask on the channel layer; forming an opening portion by removing part of the selective-growth mask; forming ridge portions by growing the source layer in the opening portion in a manner that the selective-growth mask is sandwiched by the ridge portions; removing the selective-growth mask by wet etching; and forming part of a source electrode on the surface of the channel layer at a portion where the selective-growth mask has been removed.

A fifth aspect of the present invention is the process for producing a GaN related compound semiconductor element according to the fourth aspect, and is further characterized in that, in the selective-growth mask formed in the selective-growth mask forming step, an opening portion is annularly formed to surround the periphery of a center part of the selective-growth mask.

A sixth aspect of the present invention is the process for producing a GaN related compound semiconductor element according to the fifth aspect, and is further characterized in that the selective-growth mask has any one of a circular shape and a polygonal shape.

A seventh aspect of the present invention is the process for producing a GaN related compound semiconductor element according to the fourth aspect, and is further characterized in that, in the removing step, only part, sandwiched by the ridge portions, of the selective-growth mask is removed.

An eighth aspect of the present invention is a GaN related compound semiconductor element including: a channel layer made of a GaN related compound semiconductor; a source layer; and a drain layer; and a gate electrode. In the GaN related compound semiconductor element, the channel layer is sandwiched by the source layer and the drain layer, and the gate electrode is formed in a manner that the direction of the longer dimension of the gate electrode is aligned with the m plane of the channel layer.

A ninth aspect of the present invention is the GaN related compound semiconductor element according to the eighth aspect, and is further characterized in that the gate electrode includes a bent portion.

A tenth aspect of the present invention is the GaN related compound semiconductor element according to the ninth aspect, and is further characterized in that the bent portion has a curved shape.

An eleventh aspect of the present invention is a GaN related compound semiconductor element including: a channel layer made of a GaN related compound semiconductor; a source layer; and a drain layer. In the GaN related compound semiconductor element, the channel layer is sandwiched by the source layer and the drain layer, and the channel layer has a multilayer structure including an undoped GaN related layer in a middle portion thereof.

A twelfth aspect of the present invention is the GaN related compound semiconductor element according to the eleventh aspect, and is further characterized in that a GaN layer is formed on a side, being in contact with an electrode, among the multiple layers of the channel layer.

A thirteenth aspect of the present invention is the GaN related compound semiconductor element according to the twelfth aspect, and is further characterized in that the channel layer includes an AlGaN layer doped with an impurity.

A fourteenth aspect of the present invention is the GaN related compound semiconductor element according to the eleventh aspect, and is further characterized in that the undoped GaN related layer is formed of any one of an undoped GaN layer and an undoped AlGaN layer.

According to the first or fourth aspect of the present invention, the source layer is formed by selective growth. Then, the source electrode is formed to be partially in contact with the surface of the channel layer after the mask used for the selective growth is removed therefrom by wet etching. Accordingly, the channel layer is not damaged. As a result, it is possible to reduce the contact resistance of the channel layer, and further to reduce the on-resistance. In addition, since the source layer is formed by selective growth, it is possible to reduce the density of dislocations of lattice defects in the source layer.

Moreover, the selective-growth mask is not completely stripped off, but part of the selective-growth mask is left. Then, the gate electrode is formed on the left part of the selective-growth mask. This eliminates a need for stacking separately an insulating film for forming the gate electrode.

According to the eighth aspect of the present invention, the gate electrode is formed in a manner that the direction of the longer dimension of the gate electrode is aligned with the m plane of the channel layer. With this structure, even if a crack runs along the m planes of the crystals of the GaN related compound semiconductor, the gate electrode is unlikely to be cut in the direction of the longer dimension in which the gate electrode is strong. As a result, it is possible to secure the population inversion in the channel layer by preventing the gate electrode from being cut, and to thus reduce the on-resistance.

On the other hand, suppose a case where the gate electrode is formed in a bent shape. In this case, by forming the bent portion with a curved shape, but not forming a corner, it is possible to prevent concentration of an electric field, and to thus prevent short-circuiting.

According to the eleventh aspect of the present invention, the channel layer is formed to have a multilayer structure, and the undoped GaN related layer doped with no impurity is formed as an intermediate layer in the multilayer structure. Accordingly, in comparison with a case where only one n type or p type GaN layer is provided, a depletion layer expands in the lateral directions, so that the population inversion is likely to occur. As a result, it is possible to reduce the on-resistance.

Furthermore, according to the thirteenth or fourteenth aspect of the present invention, the undoped GaN related layer is formed of undoped AlGaN, and otherwise an AlGaN layer doped with an impurity is formed as the intermediate layer. As a result, it is possible to suppress an occurrence of a crack in the channel layer more effectively than a multilayer structure formed entirely of GaN layers.

BRIEF DESCRIPTION OF THE DRAWINGS

FIG. 5 is a production step of the process for producing the GaN related compound semiconductor element of the present invention.

FIG. 6 is a production step of the process for producing the GaN related compound semiconductor element of the present invention.

FIG. 13 shows an example of a gate electrode having a curved shape in each of bent portions thereof.

FIG. 14 shows another example of a gate electrode having a curved shape in each of bent portions thereof.

DETAILED DESCRIPTION OF THE INVENTION

Figure 1:
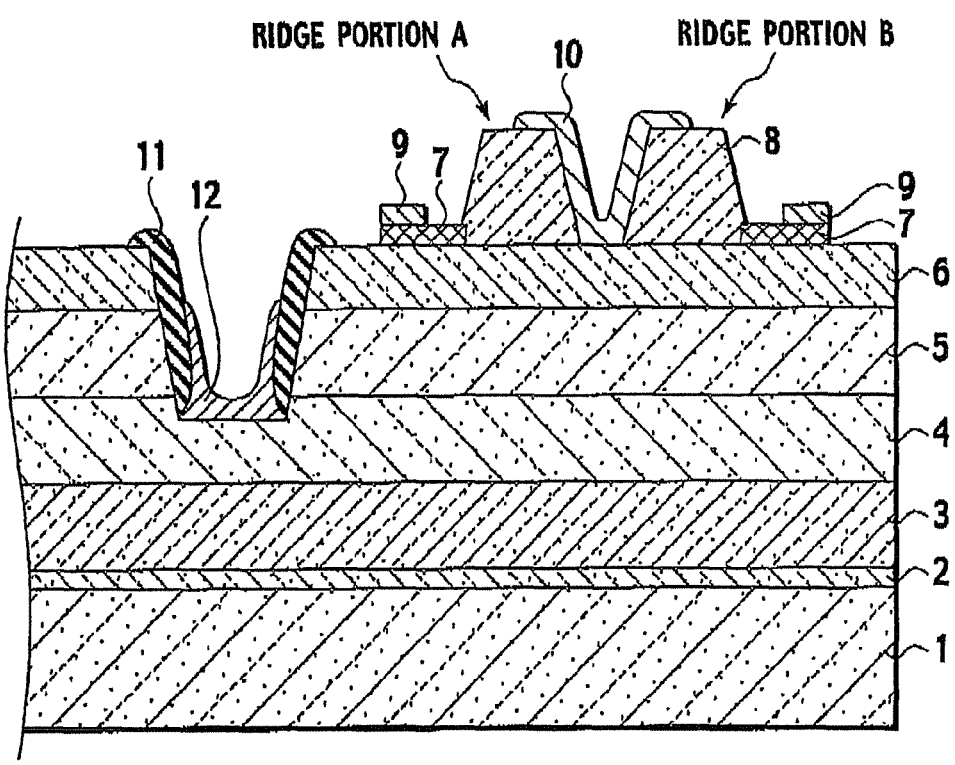
FIG. 1 shows a cross-sectional structure of a GaN related compound semiconductor element of the present invention.
Figure 2:
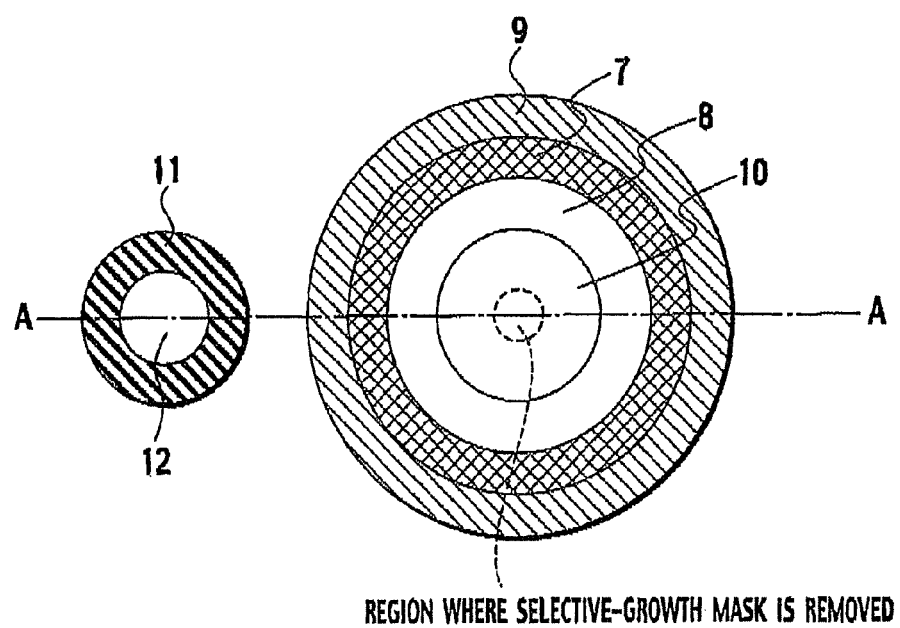
FIG. 2 shows the GaN related compound semiconductor element of FIG. 1 as seen from above the element.

Hereinafter, embodiments of the present invention will be described with reference to the drawings. FIG. 1 shows a cross-sectional structure of a GaN related compound semiconductor element of the present invention. FIG. 2 is a top view of the GaN related compound semiconductor element of FIG. 1 as seen from above the element. A cross-section taken along the line A-A in FIG. 2 corresponds to the cross-section shown in FIG. 1. Unless otherwise stated, a GaN related III-V group compound semiconductor, which is a hexagonal compound semiconductor, is used for the GaN related compound semiconductor element in each embodiment. The GaN related III-V group compound semiconductor is a quaternary compound expressed by $Al_xGa_yIn_zN$ (where $x+y+z=1$, $0 \leq x \leq 1$, $0 \leq y \leq 1$, and $0 \leq z \leq 1$). While FIG. 1 shows an example of an NPN structure, the present invention may be applied to a PNP structure instead.

A GaN buffer layer 2, an undoped GaN layer 3, an $n^+$ type GaN drain layer 4, an $n^-$ type GaN layer 5, a p type GaN related channel layer 6 are stacked on a sapphire substrate 1. An n type GaN source layer 8 having a ridge shape is formed on the p type GaN related channel layer 6. The n type GaN source layer 8 includes two ridge portions A and B. A source electrode 10 is formed over: the upper surfaces and the side surfaces of the ridge portions A and B; and part of the surface of the p type GaN related channel layer 6, between the ridge portions A and B. A selective-growth mask 7 used for selective growth, and made of an insulating material is formed in a manner of sandwiching the ridge portions A and B. A gate electrode 9 is formed on the selective-growth mask 7.

In addition, the $n^+$ type GaN drain layer 4 is partially exposed to the outside in a groove formed by mesa etching. A drain electrode 12 is formed on the exposed part, inside the groove, of the $n^+$ type GaN drain layer 4. In order to prevent leakage from the drain electrode 12, an insulating film 11 is provided over the side surface of the p type GaN related channel layer 6, the side surface of $n^-$ type GaN layer 5, and part of the side surface of the $n^+$ type GaN drain layer 4. As will be described later, while the n type GaN source layer 8 is formed by selective growth, the selective-growth mask 7 used at this time is utilized as an insulating film for the gate electrode 9.

For the selective-growth mask 7, a transparent insulating material, such as $SiO_2$, $Si_3N_4$, $ZrO_2$, or $Al_2O_3$, is used. On the other hand, as the p type GaN related channel layer 6, used is a p type GaN layer, or a laminate in which a p type GaN layer is stacked on a p type AlGaN layer. Si is used as the n type dopant, while Mg is used as the p type dopant.

The $n^+$ type GaN drain layer 4 is doped with the impurity Si to have a carrier concentration of, for example, $1 \times 10^{18}$ cm$^{-3}$ in order to form an ohmic contact with the drain electrode 12. The $n^-$ type GaN layer 5 is an intermediate layer provided to lower the energy barrier at the bonding interface between the n type layer and the p type layer, thus allowing a current to smoothly flow. The $n^-$ type GaN layer 5 is doped with the impurity Si to have a carrier concentration of $1 \times 10^{17}$ cm$^{-3}$. On the other hand, the p type GaN related channel layer 6 needs a high carrier concentration for the purpose of preventing the element from being turned ON in a state where a voltage is not applied to the gate electrode 9. For this reason, the p type GaN related channel layer 6 is doped with the impurity Mg to have a carrier concentration of, for example, $4 \times 10^{16}$ cm$^{-3}$ to $1 \times 10^{18}$ cm$^{-3}$.

A multilayer metal film made of TaSi/Au is used for the source electrode 10 and the drain electrode 12, while a multilayer metal film made of Ni/Au, or the like, is used for the gate electrode 9.

A substrate for growth, such as a sapphire substrate, and GaN are different from each other in lattice constants. Accordingly, in a GaN related compound semiconductor layer grown on the substrate for growth, a dislocation (lattice defect) extending from the substrate in the up-and-down directions exists. An increase of the lattice defects makes it difficult to form a p type or n type layer by diffusing a dopant therein. Hence, the lattice defect largely affects on electronic devices in terms of breakdown voltage characteristics and the like. For this reason, it is important to reduce the density of dislocations in view of an improvement in the performance of devices. As a method for reducing such dislocations, the epitaxial lateral overgrowth (ELO) method is well known. In the present invention, this epitaxial lateral overgrowth method is used.

Since the p type GaN related channel layer 6 is covered with the selective-growth mask 7 made of a dielectric mask or the like, the growth (selective growth) occurs firstly from the opening portion in the selective-growth mask 7. Thereafter, the growth layer extends onto the selective-growth mask 7, so that the crystal growth layer extending in the lateral direction is formed.

In this respect, it is necessary that the selective-growth mask 7 has the opening portion for allowing the crystal growth to be performed. The shape of the n type GaN source layer 8 thus formed varies in accordance with the shape of a mask. FIGS. 9A to 9D show examples of patterns of the selective-growth mask. In each of FIGS. 9A to 9D, a meshed region represents the selective-growth mask.

Figure 9A:
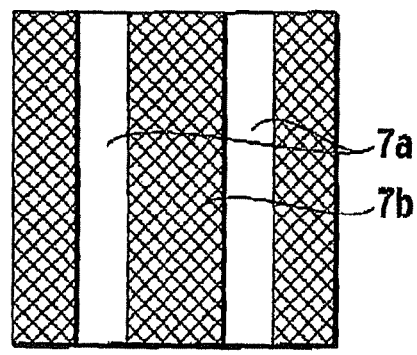
FIG. 9A to FIG. 9D show examples of patterns of a selective-growth mask.

In FIG. 9A, a center mask portion 7b is patterned in a stripe shape. In addition, opening portions 7a each having a stripe shape are provided respectively on both sides of the center mask portion 7b. When crystal growth is performed through these opening portions 7a, an epitaxial layer is formed into a shape having two stripe ridge portions.

Figure 9B:
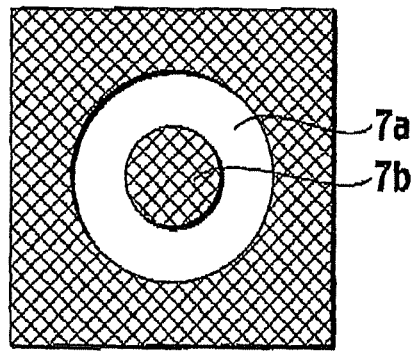

FIG. 9B shows a pattern in which an opening portion 7a is provided concentrically around a circular center mask portion 7b as the center. When crystal growth is performed through this opening portion 7a, an epitaxial layer is formed into a shape having a doughnut-shaped ridge portion.

Figure 9C:
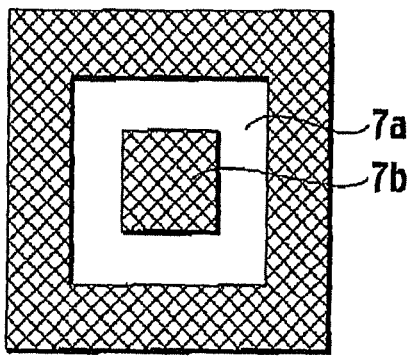

FIG. 9C shows a pattern in which an opening portion 7a is provided concentrically around a rectangular center mask portion 7b as the center. Accordingly, the opening portion 7a also has a rectangular shape. When crystal growth is performed through this opening portion 7a, an epitaxial layer is formed into a shape having a rectangular ridge portion.

Figure 9D:
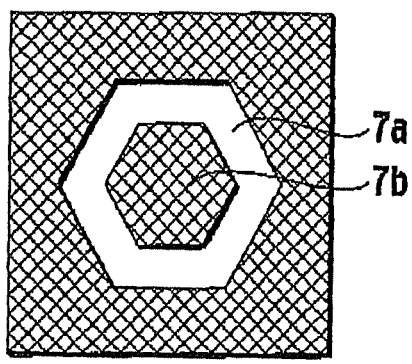

FIG. 9D shows a pattern in which an opening portion 7a is provided concentrically around a hexagonal center mask portion 7b as the center. Accordingly, the opening portion 7a also has a hexagonal shape. When crystal growth is performed through this opening portion 7a, an epitaxial layer is formed into a shape having a hexagonal ridge portion.

In the embodiment shown in FIG. 1, the circular pattern shown in FIG. 9B is used as the shape of the selective-growth mask, while the entire shape of the mask is also patterned into a circular shape. As shown in FIG. 2, the entire shape of the selective-growth mask 7 is formed into a circular shape. When the selective-growth mask 7 in which the opening portion 7a and the center mask portion 7b are concentrically formed is used, the n type GaN source layer 8 is formed into a circular shape. Then, the source electrode 10 and the gate electrode 9, which will be thereafter stacked, are also formed each into a circular shape.

Figure 3:
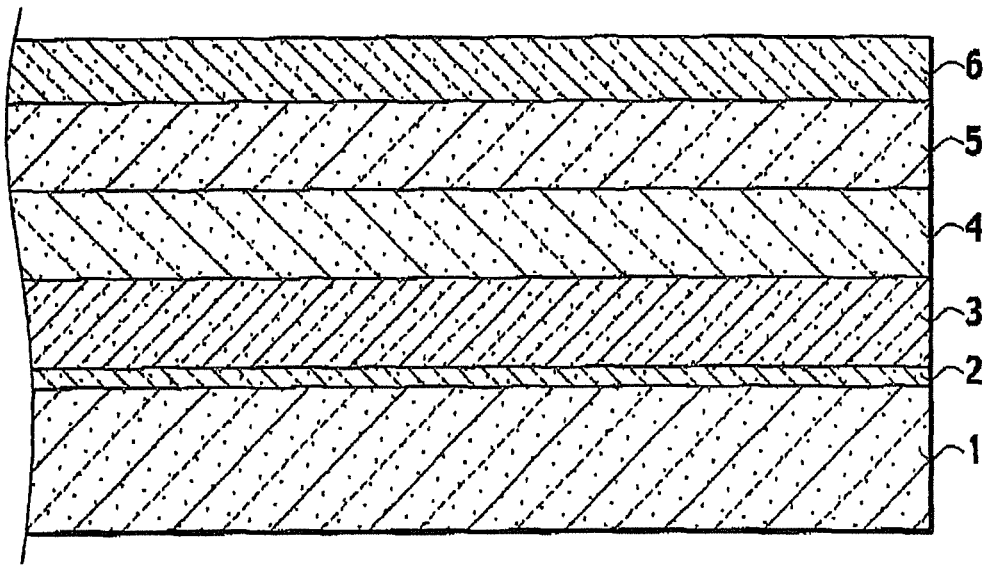
FIG. 3 is a production step of a process for producing the GaN related compound semiconductor element of the present invention.

Next, descriptions will be given of a process for producing the GaN related compound semiconductor element shown in FIGS. 1 and 2. As the producing process, a MOCVD (metal organic chemical vapor deposition) method is mainly employed. Firstly, the sapphire substrate 1 is loaded in a MOCVD system. Then, as shown in FIG. 3, the GaN buffer layer 2 is grown on the sapphire substrate 1 at a low temperature of 600° C. to 700° C. Thereafter, the substrate temperature is increased to 1000° C. or more, and the undoped GaN layer 3, the n$^+$ type GaN drain layer 4, the n$^-$ type GaN layer 5, the p type GaN related channel layer 6 are epitaxially grown sequentially on the GaN buffer layer 2. The p type GaN related channel layer 6 may be a p type GaN layer, or a layer having a multilayer structure in which a p type GaN layer is stacked on a p type AlGaN layer.

For example, a GaN layer is formed by using trimethylgallium (TMGa), which is a source gas of Ga atoms, and ammonia (NH$_3$), which is a source gas of nitrogen atoms, along with hydrogen or nitrogen which serves as a carrier gas. When an n type GaN layer is formed, silane (SiH$_4$) or the like is added, as an n type dopant gas, to the above-mentioned reaction gas. On the other hand, when a p type GaN layer is formed, CP$_2$Mg (bis(cyclopentadienyl)magnesium) or the like is added, as a p type dopant gas, to the above-mentioned reaction gas. When an AlGaN layer is formed, trimethylaluminum (TMA) is added to TMGa and NH$_3$.

As described above, a reaction gas corresponding to the components of each semiconductor layer is supplied along with a dopant gas for forming an n type layer or a p type layer, while the substrate temperature is changed to an appropriate growth temperature for the corresponding layer. In this manner, the crystals of each layer are sequentially grown, so that each semiconductor layer of a predetermined composition and a predetermined conductivity type is formed to have a necessary thickness. The doping concentration of each impurity is adjusted by controlling the amount of flow of the corresponding source gas.

Figure 4:
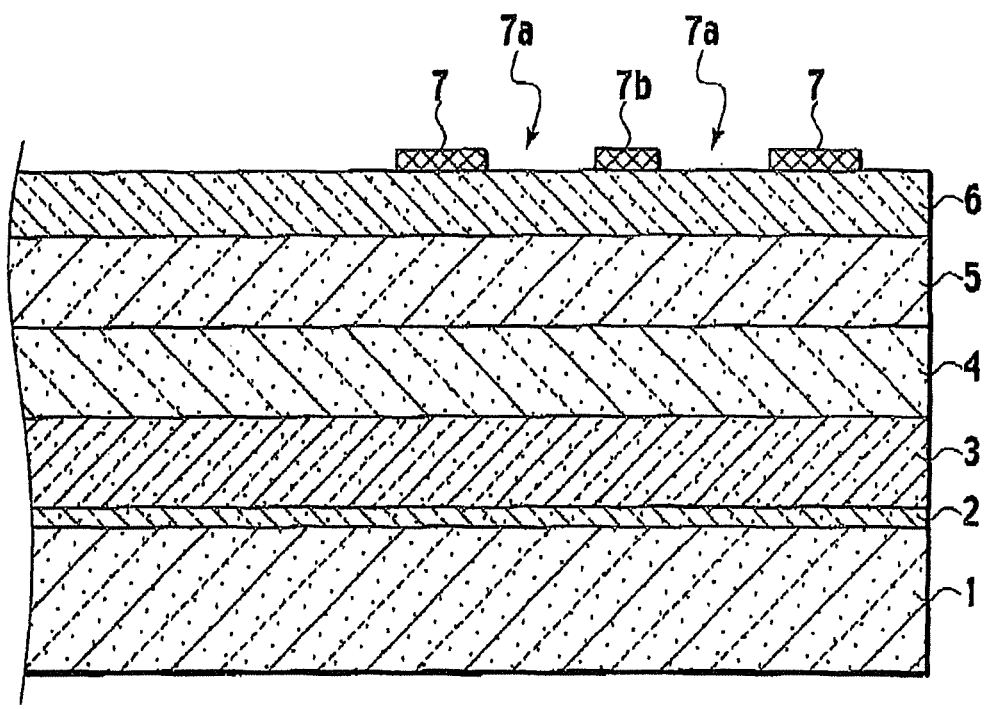
FIG. 4 is a production step of the process for producing the GaN related compound semiconductor element of the present invention.

Subsequently, the wafer having the layers stacked thereon as shown in FIG. 3 is taken out from the MOCVD system, and the selective-growth mask 7 is deposited on the p type GaN related channel layer 6 by CVD, plasma CVD, sputtering, or the like. A resist is then formed, and patterned into a predetermined shape on the selective-growth mask 7. Thereafter, as shown in FIG. 4, the entire shape of the selective-growth mask 7 is formed by wet etching using BHF, or dry etching using CF$_4$, and concurrently the opening portion 7a is formed by selectively etching the selective-growth mask 7. After that, the resist is removed, for example, by a method using acetone or methanol, or by an O$_2$ ashing method.

Here, as the pattern of the resist, used is the pattern shown in FIG. 9B, and concurrently having a circular entire shape, in order to obtain the shape shown in FIG. 2. Crystal growth is started again in the MOCVD system, so that, as shown in FIG. 5, the n type GaN source layer 8 is formed by selective growth, where the crystal growth is performed through the opening portion 7a of the selective-growth mask 7. The n type GaN source layer 8 is formed to have ridge shapes respectively on the right and left of the center mask portion 7b as the center. More specifically, these ridge shapes are formed into a continuous annular shape surrounding the periphery of the center mask portion 7b.

Then, as shown in FIG. 6, part of the selective-growth mask 7, surrounded by the right and left ridge portions, is stripped off by wet etching using a hydrofluoric (HF) acid solution or the like. A region surrounded by a dashed line in FIG. 2 corresponds to the region where the selective-growth mask 7 is removed.

Figure 7:
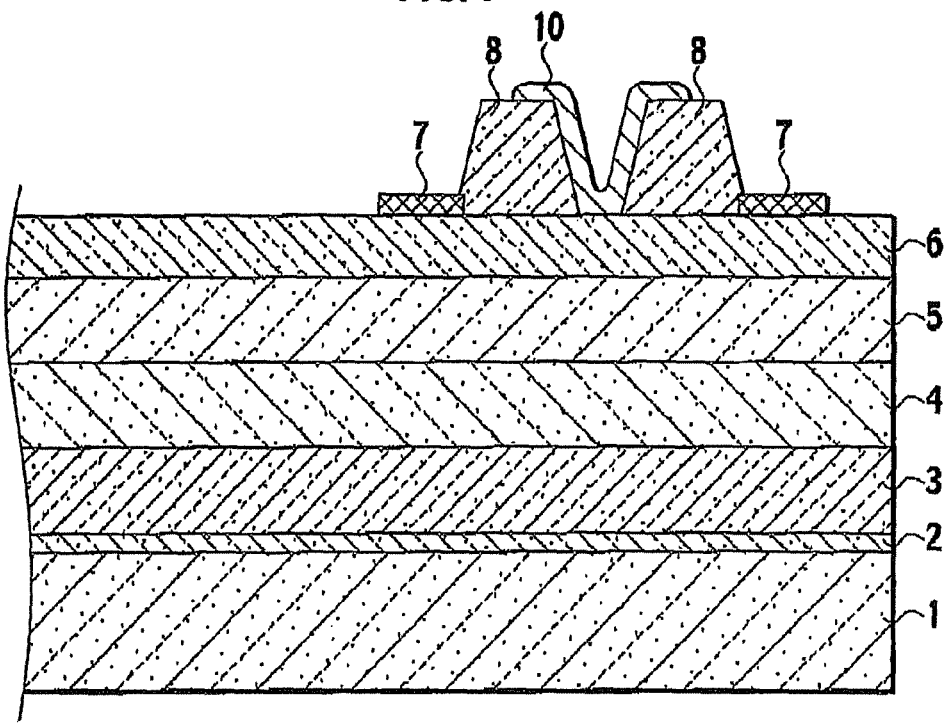
FIG. 7 is a production step of the process for producing the GaN related compound semiconductor element of the present invention.
Figure 8:
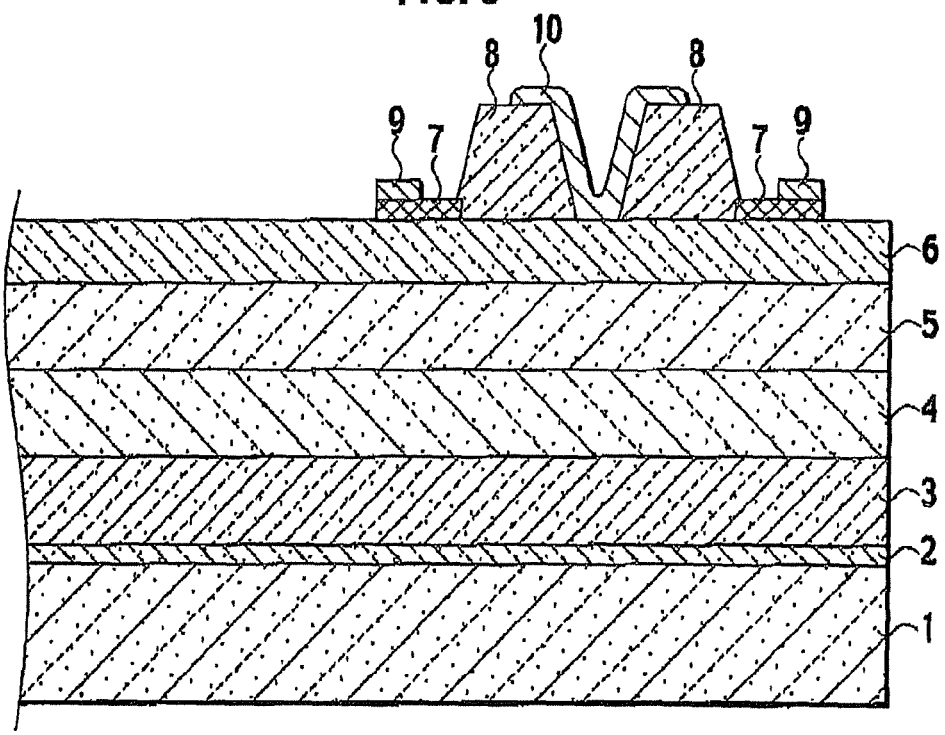
FIG. 8 is a production step of the process for producing the GaN related compound semiconductor element of the present invention.

Next, as shown in FIG. 7, the source electrode 10 is formed, by deposition, sputtering or the like, over the side surfaces of the right and left ridge portions of the n type GaN source layer 8, as well as the region, where the selective-growth mask 7 has been removed, of the surface of the p type GaN related channel layer 6. In addition, as shown in FIG. 8, the gate electrode 9 is formed on the remaining selective-growth mask 7 by deposition, sputtering or the like.

The source electrode 10 is formed over: the side surfaces, on the inner side, of the respective ridge portions, continuously forming a doughnut shape, of the n type GaN source layer 8; part of the upper surfaces of the respective ridge portions thereof; and the region, where the selective-growth mask 7 has been removed. In addition, as shown in FIG. 2, the source electrode 10, the n type GaN source layer 8, the gate electrode 9, the selective-growth mask 7, and the like are formed concentrically when viewed from above.

Next, the groove portion is formed to extend from the p type GaN related channel layer 6 to the $n^+$ type GaN drain layer 4 by mesa etching, so that the $n^+$ type GaN drain layer 4 is exposed to the outside. Then, the insulating film 11 made of $SiO_2$ or the like is deposited, by CVD, plasma CVD, sputtering or the like, in the groove portion formed by the mesa etching. The portion on the $n^+$ type GaN drain layer 4 except the exposed surface and side surfaces of the $n^+$ type GaN drain layer 4 is covered with a resist. Then, part (part not covered with the resist) of the insulating film 11 is removed by etching. After that, the drain electrode 12 is formed, by deposition, sputtering or the like, on the region where the part of the insulating film 11 has been removed. In the above-described way, the GaN related compound semiconductor element shown in FIGS. 1 and 2 is produced.

As described above, the ridge portions of the source layer are formed by selective growth, and then the selective-growth mask located at the center sandwiched by the ridge portions is stripped off by wet etching using an acidic solution. Accordingly, it is possible to prevent the channel layer below the selective-growth mask from being damaged, and to thus possible to form an ohmic contact in the junction region between the source electrode and the channel layer. As a result, the contact resistance of the source layer can be reduced. In addition, when there is no damage in the channel layer, the interface state density is reduced. Accordingly, when a voltage is applied to the gate electrode, the channel is immediately inverted to the n type or the p type. The speed of the population inversion is increased while the on-resistance is reduced. As a result, the element can operate at a high speed. Moreover, the selective growth makes it possible to reduce the density of dislocations of lattice defect, in the source layer.

Figure 10:
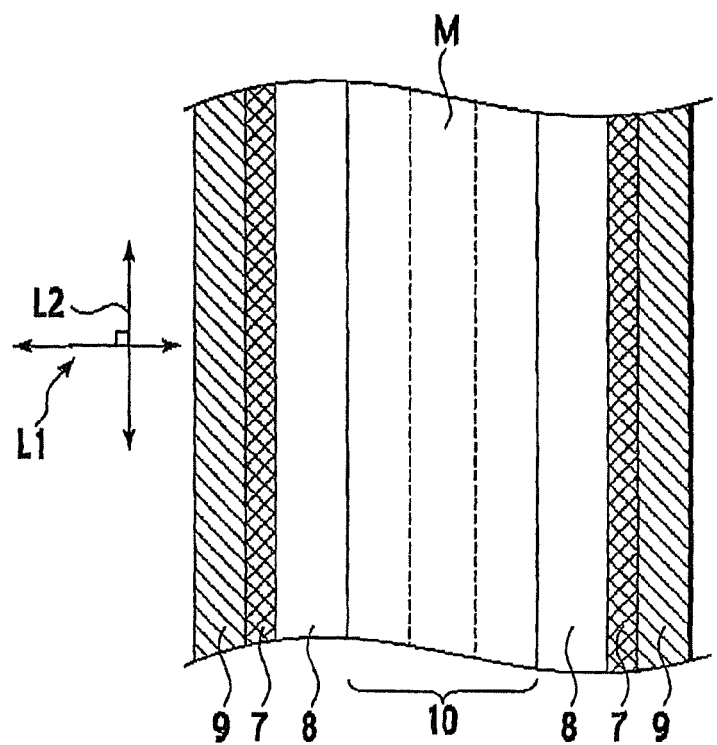
FIG. 10 shows another shape of the GaN related compound semiconductor element of FIG. 1 as seen from above the element.
Figure 11:
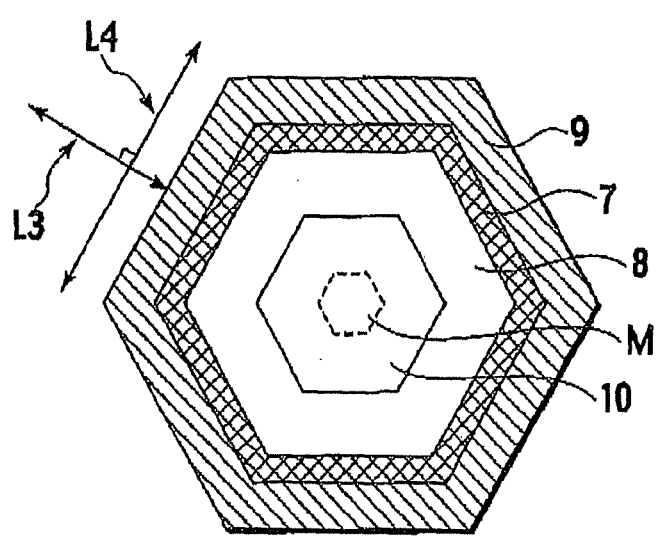
FIG. 11 shows another shape of the GaN related compound semiconductor element of FIG. 1 as seen from above the element.

Hereinafter, descriptions will be given of another embodiment of a GaN related compound semiconductor element of the present invention. In this embodiment, the gate electrode of the element is hardly cut off even when the wafer is cracked, so that the population inversion of a channel layer is secured. In the same manner as that in the aforementioned embodiment, FIG. 1 shows a cross-sectional structure of the GaN related compound semiconductor element. FIGS. 10 and 11 show examples having different ridge shapes of ridge portions A and B from each other. Each of FIGS. 10 and 11 is a top view when the GaN related compound semiconductor element of FIG. 1 is seen from above. Descriptions will be omitted of the same parts as those of the aforementioned embodiment, in terms of the process and the materials for producing the structure shown in FIG. 1.

A GaN buffer layer 2, an undoped GaN layer 3, an $n^+$ type GaN drain layer 4, an $n^-$ type GaN layer 5, and a p type GaN related channel layer 6 are stacked on a sapphire substrate 1. An n type. GaN source layer B having a ridge shape is formed on the p type GaN related channel layer 6. The n type GaN source layer 8 includes two ridge portions A and B. A source electrode 10 is formed over the upper surfaces and the side surfaces of the ridge portions A and B, and also on the surface of the p type GaN related channel layer 6 between the ridge portions A and B. A selective-growth mask 7 made of an insulating material is formed in a manner of sandwiching the ridge portions A and B. A gate electrode 9 is formed on the selective-growth mask 7.

As has been already described, the c plane (0001) of the sapphire substrate 1 is used for the growth of the GaN related compound semiconductor crystal. The GaN related compound semiconductor stacked on the sapphire substrate of the (0001) orientation has the wurtzite crystal structure (the crystal structure shown in FIG. 12) of the (0001) orientation. Accordingly, all the GaN related compound semiconductor layers stacked on the c plane (0001) of the sapphire substrate grow in the direction of the growth surface on the c plane. For this reason, the layers from the GaN buffer layer 2 to the p type GaN related channel layer 6 are all stacked in the c-axis direction, and have the growth surface on the c plane.

On the other hand, as described above, the n type GaN source layer 8 is fabricated by using the epitaxial lateral overgrowth (ELO) method. Each of FIGS. 9A to 9D shows an example of a pattern of the selective-growth mask for the process. In the aforementioned embodiment, the type shown in FIG. 9B is used. In this embodiment, the masks shown in FIGS. 9A and 9D are used.

In FIG. 9A, the center mask portion 7b is patterned in a stripe shape. In addition, the opening portions 7a each having a stripe shape are provided respectively on both sides of the center mask portion 7b. When crystal growth is performed through these opening portions 7a, an epitaxial layer is formed into a shape having two stripe ridge portions.

FIG. 10 shows the shape of a structure where the layers from the selective-growth mask 7 to the source electrode 10 are stacked by using the selective-growth mask shown in FIG. 9A. Reference symbol M in FIG. 10 denotes a region where the center mask portion 7b of the selective-growth mask 7 is removed. Ridge portions A and B formed to sandwich the region M extend in parallel to each other in the shape of a stripe each. A gate electrode 9 is formed also in a stripe.

Figure 12:
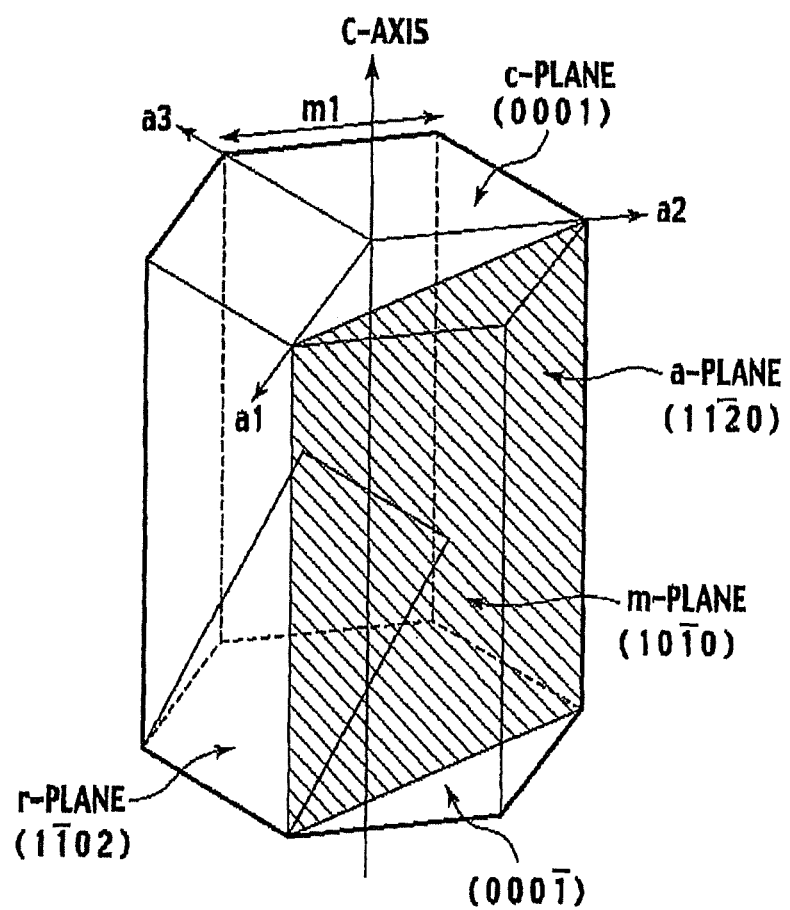
FIG. 12 shows a wurtzite single crystal structure.

In this case, the narrowest region of the gate electrode 9 is weak in strength. Accordingly, the gate electrode 9 is likely to be cut off in the direction L1 that is a direction of the shorter dimension of the gate electrode 9, while being most unlikely to be cut off in the direction L2 that is a direction along the longer dimension of the gate electrode 9. For this reason, in the case shown in FIG. 10, the gate electrode 9 may be formed to have the direction of the longer dimension thereof aligned with the m plane of the crystal of the p type GaN related channel layer 6 (for example, the direction m1 in FIG. 12 is made parallel to the direction L2 in FIG. 10). This makes it possible to prevent the gate electrode 9 from being cut off due to a crack. There are directions of the other m planes. However, since the directions of each two of the m planes intersect with each other at an angle of 120° as shown in FIG. 12, the directions of the other m planes do not coincide with the direction L1, thus making it difficult for the gate electrode 9 to be cut off.

On the other hand, FIG. 9D shows a pattern in which the opening portion 7a is provided concentrically around the hexagonal center mask portion 7b as the center. Accordingly, the opening portion 7a also has a hexagonal shape. When crystal growth is performed through this opening portion 7a, an epitaxial layer is formed into a shape having a hexagonal ridge portion. FIG. 11 shows the state of the hexagonal ridge portion. Reference symbol M in FIG. 11 denotes a region where the center mask portion 7b of the selective-growth mask 7 is removed. Ridge portions A and B formed to sandwich the region M are formed in a continuous annular shape, while a gate electrode 9 is formed also into a hexagonal shape.

The gate electrode 9 is weakest in strength in a direction in which the pattern has the narrowest width, that is, the direction L3, which is a direction along the shorter dimension of the gate electrode 9. On the other hand, the gate electrode 9 is strongest in the direction L4, which is a direction along the longer dimension of the gate electrode 9. For this reason, in the case shown in FIG. 11, the gate electrode 9 may be formed to have the direction of the longer dimension thereof aligned with the m plane of the crystals of the p type GaN related channel layer 6 (for example, the direction m1 in FIG. 12 is made parallel to the direction L4 in FIG. 11). This makes it possible to prevent the gate electrode 9 from being cut off due to a crack. There are directions of the other m planes. However, since the directions of each two of the m planes intersect with each other at an angle of 120° as shown in FIG. 12, the directions of the other m planes do not coincide with the direction L3, thus making it difficult for the gate electrode 9 to be cut off.

Next, descriptions will be given of a process for producing the GaN related compound semiconductor element shown in FIG. 1, and in FIG. 10 or FIG. 11. As the producing process, a metal organic chemical vapor deposition (MOCVD) method is mainly employed. In addition, the initial processes are the same as those described in FIG. 3, and are thus omitted.

As shown in FIG. 3, the wafer having the layers stacked thereon is taken out from the MOCVD system, and the selective-growth mask 7 is deposited on the p type GaN related channel layer 6 by CVD, plasma CVD, sputtering, or the like. A resist is then formed, and patterned into a predetermined shape, on the selective-growth mask 7. Thereafter, as shown in FIG. 4, the entire shape of the selective-growth mask 7 is formed by etching, and concurrently, an opening portion is formed by selectively etching the selective-growth mask 7. After that, the resist is removed. At this time, the resist is patterned to have such a shape that the direction of the longer dimension of the opening portion of the selective-growth mask, for example, the direction of the longer dimension of the opening portion 7a in FIG. 9A or FIG. 9D is made parallel to the m plane of the p type GaN related channel layer 6.

In each of FIGS. 1, 10, and 11, the opening portion of the selective-growth mask 7 coincides substantially with the region where then type GaN source layer 8 is formed. The region M where the selective-growth mask is removed corresponds to the center mask portion. In the case of FIG. 10, the selective-growth mask 7 has a pattern in which the opening portions are provided, each in a stripe shape, with the center mask portion as the center. In the case of FIG. 11, the selective-growth mask has a pattern in which the opening portion is provided in a concentric polygon with the center mask portion as the center. When crystal growth is performed through such an opening portion, an epitaxial layer is formed into a shape having a ridge portion.

Next, crystal growth is started again in the MOCVD system, so that, as shown in FIG. 5, the n type GaN source layer 8 is formed by selective growth, where the crystal growth is performed through the opening portion of the selective-growth mask 7. The n type GaN source layer 8 is formed to have ridge shapes, that is, the ridge portions A and B, respectively on the right and left sides. More specifically, the shape shown in FIG. 10 or FIG. 11 is formed in accordance with the shape of the pattern of the selective-growth mask 7.

Thereafter, as shown in FIG. 6, the selective-growth mask 7 existing in the recess at the center, sandwiched by the ridge portions A and B is stripped off by wet etching using a hydrofluoric (HF) acid solution or the like. The region M shown in FIGS. 10 and 11 indicates the region where the selective-growth mask 7 is stripped off at this time.

Next, as shown in FIG. 7, the source electrode 10 is formed, by deposition or sputtering, over the side surfaces of the right and left ridge portions A and B of the n type GaN source layer 8, as well as the region, where the selective-growth mask 7 has been removed, of the surface of the p type GaN related channel layer 6. In addition, as shown in FIG. 8, the gate electrode 9 is formed on the remaining selective-growth mask 7 by deposition or sputtering.

The source electrode 10 is formed over the side surfaces on the inner side, and part of the upper surfaces, of the respective ridge portions A and B formed in the n type GaN source layer 8; and the region where the selective-growth mask 7 is removed. In the case of the structure shown in FIG. 10, the source electrode 10, the n type GaN source layers 8, the gate electrodes 9, the selective-growth masks 7, and the like are formed each in a stripe as seen from above. In the case of the structure shown in FIG. 11, the source electrode 10, the n type GaN source layer 8, the gate electrode 9, the selective-growth mask 7, and the like are formed in a concentric polygon as seen from above.

Next, the groove portion is formed to extend from the p type GaN related channel layer 6 to the n$^+$ type GaN drain layer 4 by mesa etching, so that the n$^+$ type GaN drain layer 4 is exposed to the outside. Then, the insulating film 11 made of SiO$_2$ or the like is deposited, by CVD, plasma CVD, sputtering or the like, in the groove portion formed by the mesa etching. The portion on the n$^+$ type GaN drain layer 4 except the exposed surface and side surfaces thereof is covered with a resist. Then, part (part not covered with the resist) of the insulating film 11 is removed by etching. After that, the drain electrode 12 is formed, by deposition, sputtering or the like, on the region where the part of the insulating film 11 has been removed. In the above-described way, the GaN related compound semiconductor element shown in FIG. 1, and FIG. 10 or FIG. 11 is produced.

Figure 17:
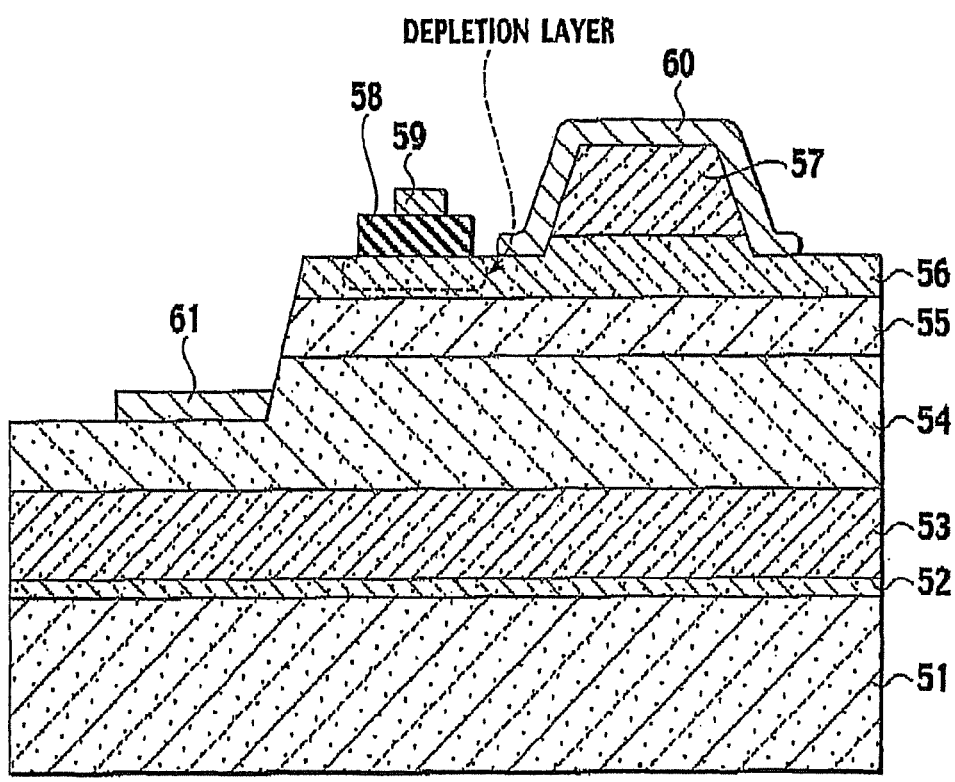
FIG. 17 shows a cross-sectional structure of a conventional GaN related compound semiconductor element.
Figure 18:
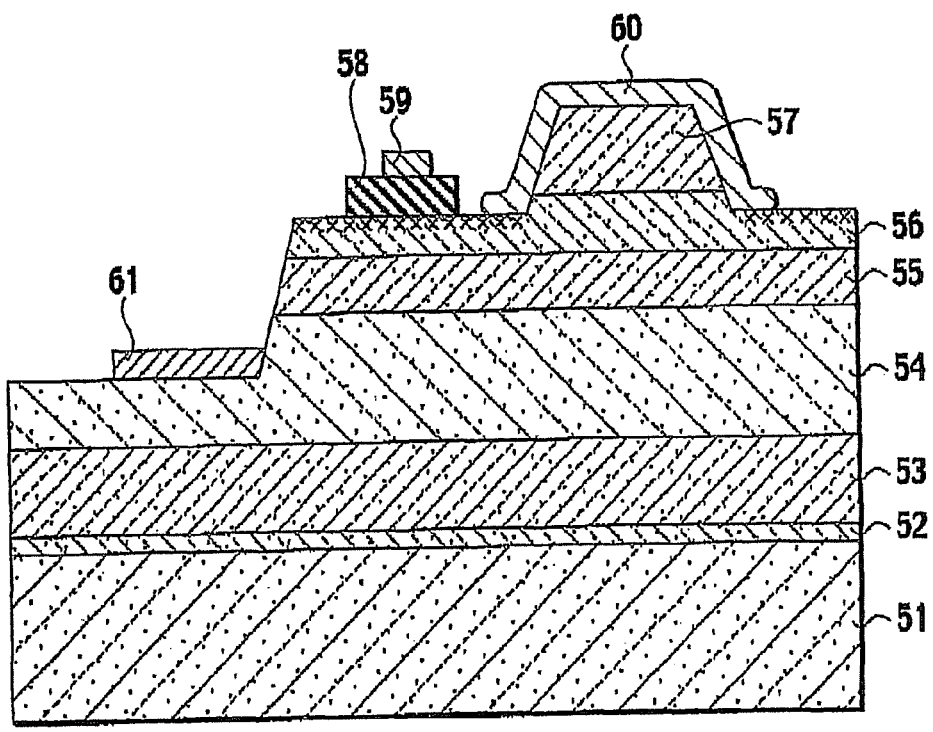
FIG. 18 shows a cross-sectional structure of another conventional GaN related compound semiconductor element.

In the aforementioned embodiments, the GaN related compound semiconductor element produced by using selective growth has been described. However, it is obvious that the present invention may be applied to the conventional structure of the GaN related compound semiconductor element shown in FIG. 17 or FIG. 18. In such case as well, the gate electrode may be formed to have the direction of the longer dimension thereof aligned with them plane of the p type GaN related channel layer.

Next, descriptions will be given of still another embodiment of a GaN related compound semiconductor element in which the gate electrode 9 is annularly formed to have a bent section as shown in FIG. 11. In FIG. 11, the hexagonal gate electrode 9 is formed to have six bent sections corresponding respectively to portions where the electrode is bent. Each of the six bent sections in FIG. 11 is formed of a corner. When a voltage is applied to the gate electrode 9, an electric field is concentrated on each corner. As a result, short-circuiting is likely to occur between the gate electrode 9 and the p type GaN related channel layer 6 over the selective-growth mask 7, which is an insulating film.

For the purpose of solving this problem, each bent section of the gate electrode 9 is formed to have a curved shape constituted of, for example, an arcuate shape or the like, as shown in FIG. 13. Reference symbol 9a denotes a curved portion in each bent section of the gate electrode 9. The curved portion 9a is formed in the inner side of each of all the six bent sections of the gate electrode 9. Since the gate electrode 9 is provided with such rounded portions, it is possible to prevent an electric field to concentrate, and to thus prevent short-circuiting from occurring.

On the other hand, FIG. 14 shows an example where the gate electrode 9 is provided with rounded portions in the outer side of each of the bent portions thereof. While the gate electrode 9 is formed in a hexagonal shape as a whole, a curved portion 9b is formed in the outer side of each of all the six bent sections of the gate electrode 9. The forming of the outer side of each bent portion in a curved shape in this manner also makes it possible to prevent an electric field to concentrate, and to thus prevent short-circuiting from occurring.

In each of the above examples, the gate electrode with the hexagonal shape has been described. However, the shape of a gate electrode may possibly be a polygon other than a hexagon. Alternatively, even if a gate electrode is not formed in an annular shape, the gate electrode needs only to have a shape including at least one bent portion with a corner. With any of such electrodes, by forming each bent portion thereof in a curved shape with roundness as shown in FIGS. 13 and 14, it is possible to prevent the concentration of an electric field.

Next, descriptions will be given of yet another embodiment in which a depletion layer is expanded in the lateral direction, so that a population inversion is more likely to occur, and that the on-resistance is thus reduced. This embodiment will be described with the structure which has been already described with reference to FIGS. 1 and 2. As has already been described above, FIG. 1 shows a cross-sectional structure of the GaN related compound semiconductor element of the present invention. FIG. 2 is a top view of the GaN related compound semiconductor element of FIG. 1 as seen from above the element. A cross-section taken along the line A-A in FIG. 2 corresponds to the cross-section shown in FIG. 1. This embodiment is different from the first embodiment only in that the p type GaN related channel layer 6 is replaced with a p type GaN related multilayer channel layer 6. The other configurations and the like of this embodiment are the same as those described above, and therefore, descriptions thereof will be omitted here.

Figure 15:
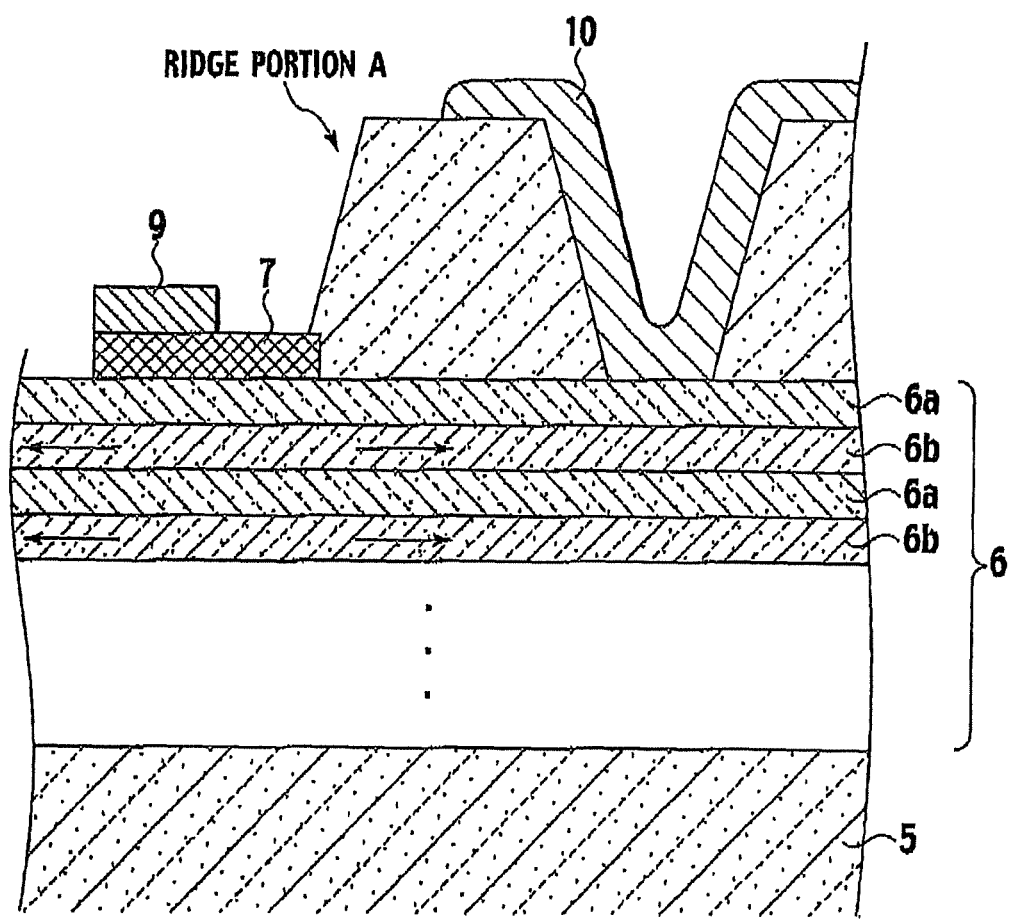
FIG. 15 shows a lamination structure of a GaN related multilayer channel layer.
Figure 16:
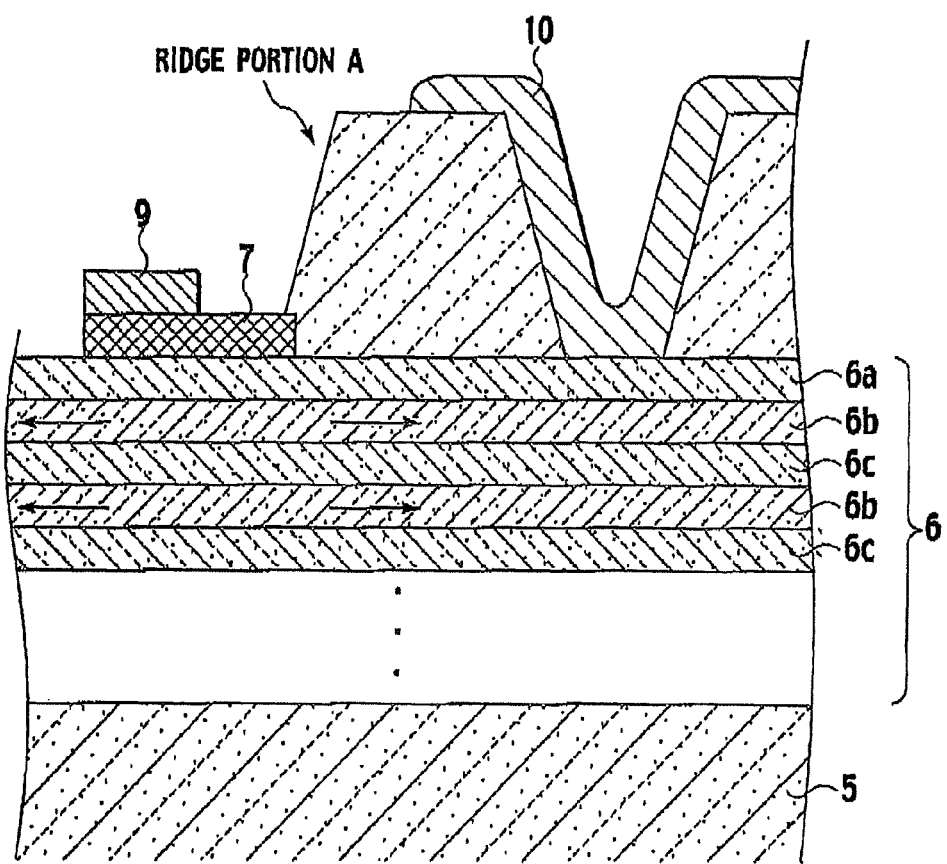
FIG. 16 shows another lamination structure of a GaN related multilayer channel layer.

The p type GaN related multilayer channel layer 6 is formed by stacking several semiconductor layers. Examples of the p type GaN related multilayer channel layer 6 are shown in FIGS. 15 and 16. In FIG. 15, the p type GaN related multilayer channel layer 6 has a multilayer structure of p type GaN layers 6a and undoped GaN related layers. Here, an undoped GaN layer 6b is used as each of the undoped GaN related layer.

The p type GaN layer 6a is firstly disposed on a side making contact with an n⁻ type GaN layer 5 (the lowermost layer). The undoped GaN layer 6b is then disposed on the p type GaN layer 6a. The p type GaN layer 6a is further disposed on the undoped GaN layer 6b. In this manner, the p type GaN layers 6a and the undoped GaN layers 6b are repeatedly and alternately stacked, so that the lamination structure is formed in which the p type GaN layer 6a is deposited as a semiconductor layer (the upper most layer) on a side making contact with an n type GaN source layer 8 and a source electrode 10.

In other words, the uppermost layer and the lowermost layer are each formed of the p type GaN layer 6a, while the undoped CaN layers 6b doped with no impurity are interposed as intermediate layers therebetween in a manner that each undoped GaN layer 6b is sandwiched by the p type GaN layers 6a.

In this structure, the area of the depletion layer is more likely to expand in the lateral directions (the directions of the arrows in FIG. 15) in each undoped GaN layer 6b doped with no impurity, than in each p type GaN layer 6a doped with an impurity to have a high carrier concentration. Accordingly, this structure allows the depletion layer to expand to portions directly below the n type GaN source layer 8 in the entire channel layer. As a result, the population inversion is likely to occur.

It is necessary to form the p type GaN layer 6a in the uppermost layer of the p type GaN related multilayer channel layer 6 for the purpose of forming an ohmic contact with the source electrode 10. In addition, it is necessary to increase the carrier concentration of the p type GaN layer 6a for the purpose of forming the ohmic contact with the source electrode 10, and also of preventing the element from being turned ON in a state where no voltage is applied to the gate electrode. For this reason, each p type GaN layer 6a is doped with the impurity Mg to have a carrier concentration of, for example, $4 \times 10^{16}$ cm$^{-3}$ to $1 \times 10^{18}$ cm$^{-3}$.

On the other hand, FIG. 16 shows another configuration of the p type GaN related multilayer channel layer 6. As in the case of FIG. 15, the uppermost layer is formed of the p type GaN layer 6a, and the intermediate layers each sandwiched by semiconductor layers doped with an impurity are formed of the undoped GaN layers 6b. However, among the intermediate layers, each semiconductor layers doped with the p type impurity is formed not of the p type GaN layer 6a but of a p type AlGaN layer 6c. It is advantageous to form, of the p type AlGaN layer, each p type doped layer other than the uppermost layer as described above, because this structure improves the strength of the element, and thus suppresses an occurrence of crack.

Although not illustrated, it is also possible to replace, with an undoped AlGaN layer, each undoped GaN layers 6b in the configuration shown in each of FIGS. 15 and 16. This configuration effectively suppresses an occurrence of crack as described above.

If too many layers were stacked in the p type GaN related multilayer channel layer 6 shown in each of FIGS. 15 and 16, the thickness of each stacked layer would be too thin. In this case, it is sometimes difficult to cause the depletion layer to expand in the lateral directions in each undoped GaN layer or each undoped AlGaN layer. For this reason, it is desirable that the number of undoped GaN related layers be 1 or 2. Moreover, a PNP MOS-FET having an n type channel layer may be configured by replacing each p type GaN layer 6a and each p type AlGaN layer 6c, in the above description, with an n type GaN layer and an n type AlGaN layer, respectively.

A process for producing the GaN related compound semiconductor element shown in each of FIGS. 15 and 16 is different from the process for producing the element shown in FIG. 1 and FIG. 2 only in that the p type CaN related channel layer 6 is replaced with the p type GaN related multilayer channel layer 6. Accordingly, the producing process is the same as those of FIGS. 3 to 8 which have already been described, and is thus omitted here.

In the above embodiments, descriptions have been given of the GaN related compound semiconductor element in which the n type GaN source layer 8 is formed by utilizing selective growth. However, it should be noted that, the lamination structure of the p type GaN related multilayer channel layer, shown in each of FIGS. 15 and 16, of the present invention may be applied to the conventional structure of a GaN related compound semiconductor element, shown in FIG. 17 or FIG. 18, and produced without utilizing selective growth. In such a case, the p type GaN related multilayer channel layer structure shown in FIGS. 15 and 16 may be employed instead of the p type GaN channel layer 56.

The GaN related compound semiconductor elements of the vertical structure, which have been described in the respective embodiments, are used as high power devices. Although each figure shows the configuration of a single element, a single GaN related compound semiconductor device may be produced in the following manner. Specifically, a large number of patterns each shown in any of the figures are fabricated in a wafer. Then, multiple source electrodes of the respective patterns are connected by wiring to one another in series or in parallel. Concurrently, multiple gate electrodes are also connected by wiring to one another in series or in parallel, while multiple drain electrodes thereof are connected in the same manner. In this manner, a single GaN related compound semiconductor device may be produced.

As have been described so far, it is to be understood that the present invention includes various embodiments and the like that are not described in this specification. Accordingly, the technical scope of the present invention should be defined only by the following claims in view of the above descriptions.

What is claimed is:

1. A GaN related compound semiconductor element comprising:
   a channel layer made of a GaN related compound semiconductor;
   a source layer including two adjacent ridge portions formed therein by selective growth;
   a drain layer;
   wherein;
   the channel layer is sandwiched by the source layer and the drain layer, and
   two selective-growth masks are left on the channel layer surface located outside of the two adjacent ridge portions and removed from a portion of the channel layer located between the two adjacent ridge portions after being used for the selective growth and formed in a manner of sandwiching the two adjacent ridge portions;
   two gate electrodes are provided on the two selective-growth masks and formed in a manner of sandwiching the two adjacent ridge portions.

2. The GaN related compound semiconductor device comprising the GaN related compound semiconductor element according to claim 1.

3. The GaN related compound semiconductor element of claim 1, wherein
   a groove portion is formed to extend from the channel layer to the drain layer so that the drain layer is partially exposed to the outside; and
   an insulating film is deposited from the channel layer to the drain layer in the groove; and
   a drain electrode is formed on the exposed part and on a part of the insulating film.

4. The GaN related compound semiconductor element of claim 1, wherein
   a source electrode is formed on top and adjacent to side surfaces of the two adjacent ridge portions and above the portion of the channel layer located between the ridges.

5. The GaN related compound semiconductor element of claim 1, wherein
   the two selective growth masks and the source layer are disposed on the same plane of the channel layer which is formed flat.

6. The GaN related compound semiconductor element of claim 1, wherein the two gate electrodes are formed in a manner that each short side of the two gate electrodes is aligned with a normal direction to the m crystal plane of the channel layer and each long side of the two gate electrodes are aligned with the m crystal plane of the channel layer.

7. The GaN related compound semiconductor element of claim 1, wherein
   the channel layer has a multilayer structure including an undoped GaN related layer in a middle portion thereof.

8. The GaN related compound semiconductor element of claim 7, wherein the undoped GaN related layer is formed of any one of an undoped GaN layer and an undoped AlGaN layer.

9. The GaN related compound semiconductor element of claim 7, wherein an electrode is in contact with a GaN layer of the multilayer channel layer.

10. The GaN related compound semiconductor element of claim 9, wherein the channel layer includes an AlGaN layer doped with an impurity.

* * * * *